United States Patent [19]

Arbus et al.

[11] Patent Number: 5,519,247
[45] Date of Patent: May 21, 1996

[54] DETECTOR CIRCUIT WITH A SEMICONDUCTOR DIODE OPERATING AS A DETECTOR AND WITH AN AMPLIFIER CIRCUIT INTEGRATED WITH THE DIODE

[75] Inventors: Richard Arbus, Älvsjö ; Kjell Bohlin, Upsala; Paul Stephanson, Bromma; Jonas Tirén, Upsala, all of Sweden

[73] Assignee: Asea Brown Boveri AB, Vasteras, Sweden

[21] Appl. No.: 313,078

[22] PCT Filed: Apr. 1, 1993

[86] PCT No.: PCT/SE93/00278

§ 371 Date: Oct. 25, 1994

§ 102(e) Date: Oct. 25, 1994

[87] PCT Pub. No.: WO93/20588

PCT Pub. Date: Oct. 14, 1993

[30] Foreign Application Priority Data

Apr. 3, 1992 [SE] Sweden .................. 9201062

[51] Int. Cl.⁶ .................. H01L 31/075; H01L 31/105; H01L 31/117

[52] U.S. Cl. .................. 257/437; 257/458; 257/463; 257/465; 330/250; 330/269; 330/277; 330/307

[58] Field of Search .................. 257/458, 461, 257/463, 437, 436, 462, 465; 330/253, 250, 264, 269, 277, 307

[56] References Cited

U.S. PATENT DOCUMENTS

| | | | |
|---|---|---|---|
| 5,101,253 | 3/1992 | Mizutani et al. | 257/458 X |
| 5,162,887 | 11/1992 | Dierschke | 257/463 X |
| 5,239,193 | 8/1993 | Benton et al. | 257/458 X |
| 5,382,824 | 1/1995 | Popovic | 257/463 X |

FOREIGN PATENT DOCUMENTS 0400754  12/1990  European Pat. Off. ............ 257/461

Primary Examiner—William Mintel
Attorney, Agent, or Firm—Watson Cole Stevens Davis

[57] ABSTRACT

A detector circuit, for example for optical radiation, has a detector diode (20) and an amplifier circuit (30) integrated with the diode in the same silicon wafer for amplification of the diode signal. The diode is designed as a lateral diode. The diode and the amplifier circuit are both produced in a homogeneously weakly doped silicon wafer (1).

8 Claims, 3 Drawing Sheets

DETECTOR CIRCUIT WITH A SEMICONDUCTOR DIODE OPERATING AS A DETECTOR AND WITH AN AMPLIFIER CIRCUIT INTEGRATED WITH THE DIODE

TECHNICAL FIELD

The present invention relates to a detector circuit with a semiconductor diode operating as a detector and with an amplifier circuit integrated with the diode.

BACKGROUND ART

By "a semiconductor diode operating as a detector" is meant in this application a semiconductor diode which is intended for and used as a radiation detector. The most common use is as a photodiode, that is, as a detector for optical radiation inside or outside the visible wavelength range. A diode of the intended kind operates under reverse bias. At the pn junction of the diode a depletion layer is then generated. Incident radiation generates electron-hole pairs in the depletion layer and thereby gives rise to a current through the diode, and the magnitude of this current is a measure of the intensity of the radiation.

Photodiodes are usually designed as vertical pin diodes, that is, with a relatively highly doped p-conducting layer at one surface of a semiconductor body, a relatively highly doped n-conducting layer at the opposite surface, and between these layers a weakly doped layer, in which the depletion layer is formed. The p-layer is provided with an anode contact and the n-layer with a cathode contact. Diodes of this kind will have a homogeneous depletion layer and thus good detection properties—the sensitivity is the same independently of where on the surface of the diode the radiation is caused to become incident. However, they must be designed with a relatively large area to attain the necessary sensitivity, and this results in a high self-capacitance and hence a low speed of operation.

Further, lateral photodiodes are known. In such, however, it has not been possible to attain the homogeneous depletion layer which the vertical diodes exhibit, and these diodes have therefore exhibited inferior detection properties.

To obtain good properties these diodes have been made of high-resistance and very high-quality (defect free) silicon, typically with a resistivity of 500–1000 ohmcm.

It is further known to design detector diodes with integrated amplifiers. The diode and the amplifier are then produced in an epitaxial silicon layer arranged on a highly doped substrate. One of the contact regions of the diode is then produced at the same surface as the amplifier, and the other contact region of the diode consists of the substrate layer. Thus, the diode is made as a vertical diode, and its depletion layer is formed in the epitaxial layer. Such a layer is well suited for amplifier circuits, for example, of CMOS type, but because of the lower silicon quality it provides an inferior function of the detector diode.

SUMMARY OF THE INVENTION

The invention aims to provide a detector circuit of the kind described in the introductory part of the description, in which a high speed of action and optimal detection properties are obtained and which can be produced by a simple and hence economical manufacturing process with a good yield.

BRIEF DESCRIPTION OF THE DRAWINGS

The invention will be described in greater detail in the following with reference to the accompanying FIGS. 1–4.

FIG. 1 shows an embodiment of a circuit according to the invention, wherein

DETAILED DESCRIPTION OF THE INVENTION

Figure 1A:
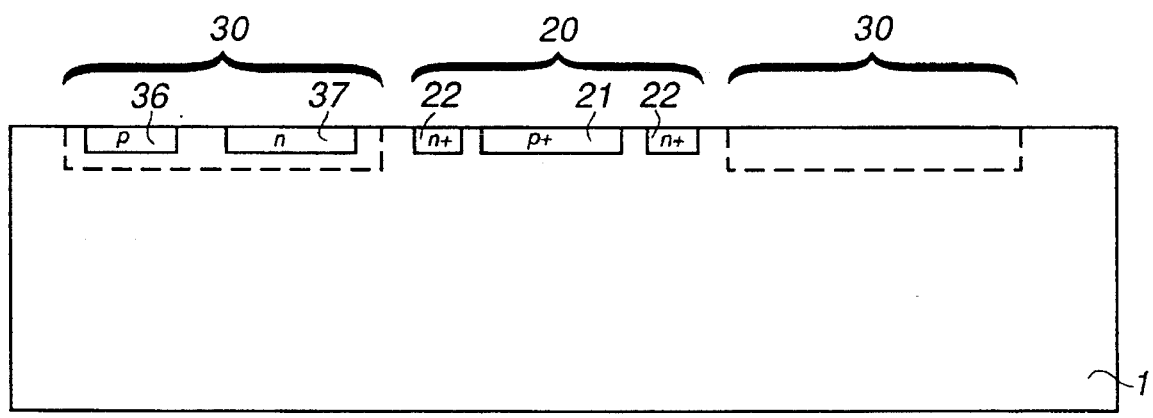
FIG. 1a shows a section through the circuit and FIG. 1b a view of that surface of the semiconductor body where the diode and the amplifier circuit are produced.
Figure 1B:
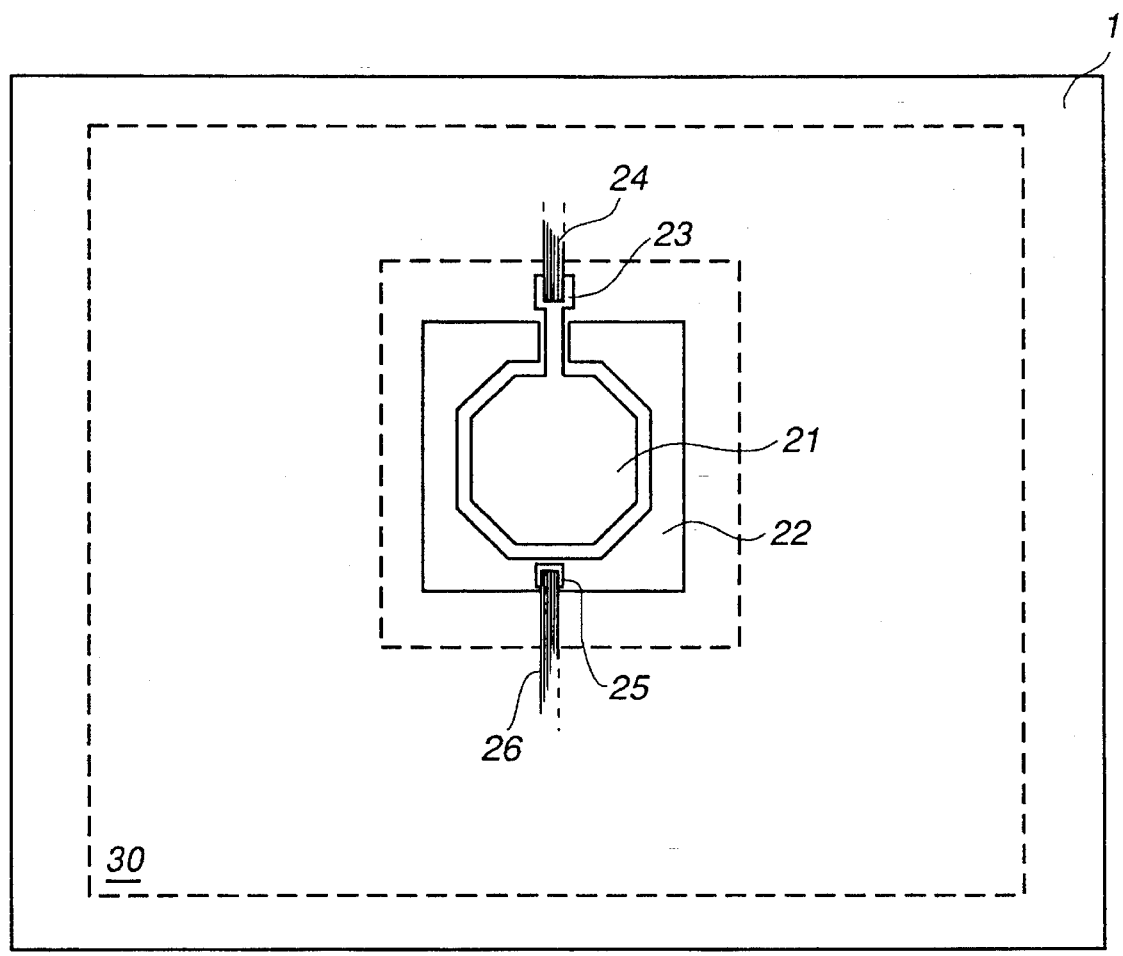

FIG. 1a and FIG. 1b show an embodiment of a detector circuit according to the invention. FIG. 1a shows a section through that semiconductor wafer in which the detector circuit is produced, and FIG. 1b is a view of the upper surface of the semiconductor wafer according to FIG. 1a. The circuit is produced in a semiconductor wafer 1 of high-quality silicon material. For that purpose it is suitable to use silicon produced by the so-called floating zone method, by means of which monocrystalline silicon with a high freedom from defects can be manufactured. The wafer 1 is homogeneously doped with a dopant of n-type, for example phosphorus. The wafer has a very low degree of doping, for example an impurity concentration of $8 \cdot 10^{12}$ cm$^{-3}$, which corresponds to a resistivity of about 550 ohmcm. The wafer 1 has an extent of 1·1 mm and a thickness of 525 µm.

As will be clear from FIG. 1, a semiconductor diode 20 operating as a detector is arranged centrally in the upper surface of the wafer 1. The diode 20 is surrounded by a region 30 where amplifier circuits for amplification of the diode signal are arranged. Within the region 30, a number of p-pockets 36 and a number of n-pockets 37 are arranged. In the p-pockets 36 a number of n-channel transistors are produced and in the pockets 37 a number of p-channel transistors are arranged. The transistors are of CMOS type. They are connected to each other and to the diode 20 in such a way that an amplifier circuit, known per se, is formed for amplification of the output signal from the diode 20.

The wafer 1 with the circuits produced therein is encapsulated in a suitable way and connected to contact means for the supply of supply voltages and for connecting the output signal of the amplifier circuit to external means.

Figure 2:
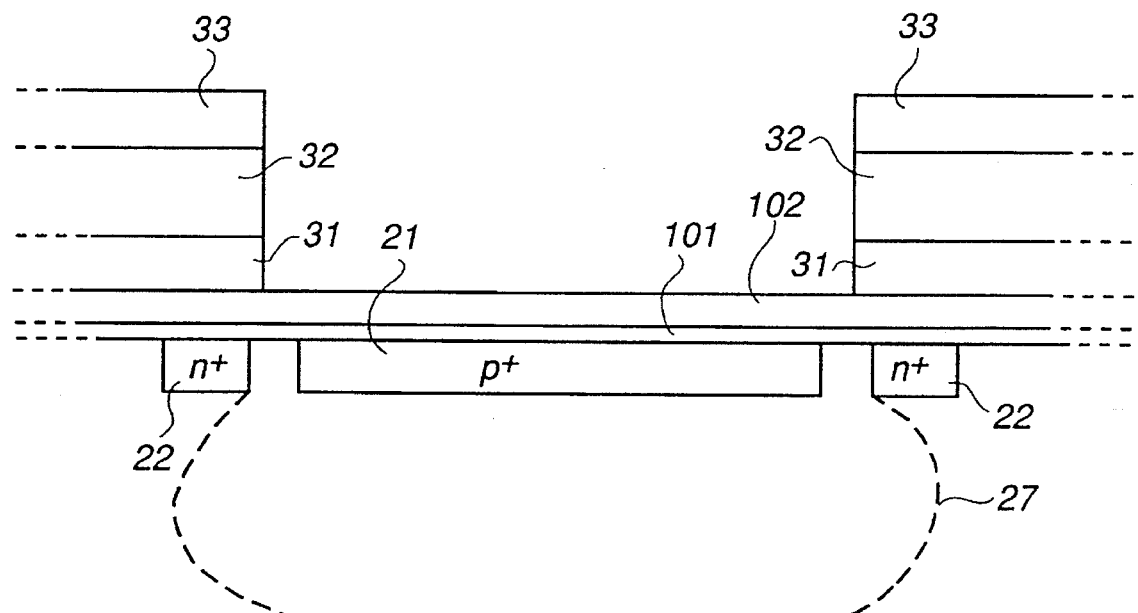
FIG. 2 shows in more detail a section through the diode shown in FIG. 1.

As shown in more detail in FIG. 2, the detector diode comprises a centrally arranged p$^+$-doped contact region 21 with a diameter of 60 µm. In the embodiment described the region is octagonal but can alternatively be in the form of a polygon with a number of sides other than eight, or be circular. The region 21 is surrounded at a distance of about 5 µm by a second contact region 22, which is n$^+$-doped. The inner limiting line of the region 22 has the same shape as the region 21 and its outer limiting line has the shape of a square. The region 21 has a thickness of 0.35 µm, and the region 22 a thickness of 0.25 µm. The regions 21 and 22 are doped with an impurity concentration of about $10^{20}$ cm$^{-3}$, which corresponds to a surface resistivity of about 50–100 ohm/square. On the surface of the silicon wafer 1 there is arranged a protective layer 101 of silicon dioxide. On top of this layer there is a layer 102 of Si$_3$BN$_4$. The layers 101 and 102 also extend over the amplifier circuits 30 and serve as protective layers also for these circuits. The thickness of the layer 102 is 60 nm and is so chosen as to constitute a quarter of a wavelength for the light which the detector is intended to detect. The mentioned thickness of the layer 102 is adapted to a wavelength (in air) of 850 nm. The layer 21 extends radially outwards through a discontinuity in the layer 22 to a region 23, where an anode contact 24 makes contact with the region 21. The layers 101 and 102 are provided, above the region 22, with an opening 25 (see FIG. 1b) where a cathode contact 26 contacts the region 22.

During operation, a voltage is applied to the diode in the reverse direction, that is, such a voltage that the cathode of the diode becomes positive in relation to its anode. In the diode described, this voltage may be, for example, 5 V. If the voltage is suitably chosen in relation to the dimensions of the diode and to the resistivity of the wafer 1, a depletion layer is formed below the region 21, and with an interface with the shape designated by the line 27. With a suitable choice of operating voltage, as can be seen a very homogeneous depletion layer is obtained, that is, the depletion layer has an approximately constant thickness below the whole region 21. This in turn means that the field intensity conditions are the same over the entire area of the region 21 and that therefore the sensitivity to detection becomes approximately constant independently of where within the region 21 incident light hits the region.

On the wafer 1 an additional protective layer 31 of boron-phosphorus silicate glass with a thickness of 800 nm is arranged, except over the central light-detecting part of the diode 20. An additional protective layer 32 of $SiO_2$ with a thickness of 1300 nm is arranged on top of the abovementioned glass layer. Since the protective layers now mentioned have a relatively good permeability to light, a light-protecting layer 33 is arranged over the amplifier circuits 30. This layer may, for example, consist of a layer of metallic titanium or titanium nitride and can be supplied by sputtering. Also other materials than those just mentioned may be used for the protective layer 33. However, the material should have a low permeability to light to prevent incident light from generating electron-hole pairs in the amplifier circuits, hence disturbing their function. Preferably, the material is also chosen so as to have low reflectance for the current light, this in order to prevent light reflected from the protective layer from disturbing the function of the diode 20 or of the other circuits arranged in the same package.

Figure 3:
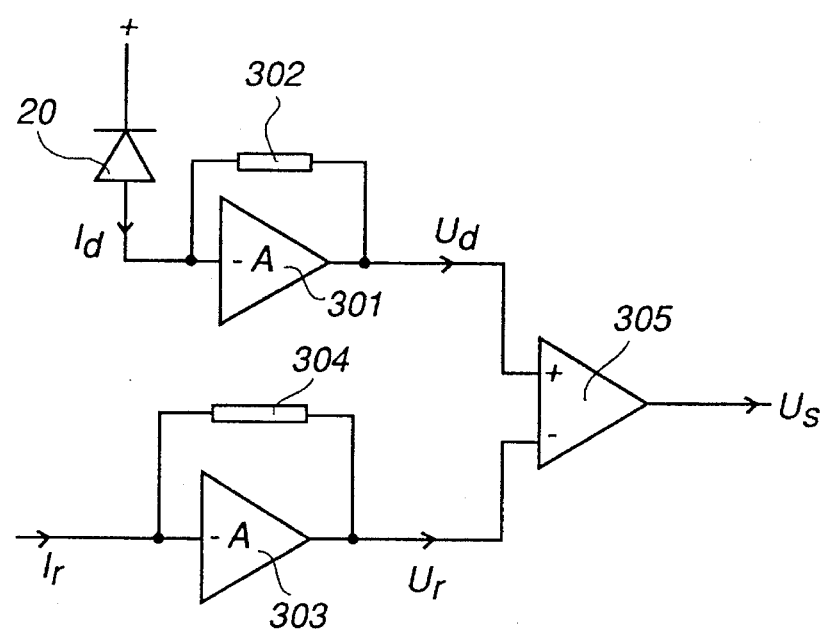
FIG. 3 shows an example of how the amplifier circuit may be designed.

FIG. 3 shows an example of how the amplifier circuits 30 may be designed and connected to the detector diode 20. The diode 20 is connected to an input of an inverting amplifier 301 of CMOS type. The amplifier is provided with a feedback resistor 302. The diode 20 is in the reverse direction. Radiation incident upon the diode generates electron-hole pairs in the depletion layer of the diode, and a current $I_d$ corresponding to the radiation intensity flows through the diode and constitutes input signal to the amplifier 301. From the amplifier an output signal Ud is obtained, which is supplied to an input of a comparator 305. A reference current $I_r$ is supplied to an input of an amplifier 303, which is provided with a feedback resistor 304. From the amplifier an output signal $U_r$ corresponding to the reference current is obtained, which output signal is supplied to a second input of the comparator 305. The output signal $U_s$ from the amplifier 305 corresponds to the difference $I_d$-$I_r$ and becomes positive when $I_d$>$I_r$. By choosing a suitable value of the reference current $I_r$, in this way such undesired detection signals can be eliminated as would otherwise have been caused by unavoidable noise or other disturbances.

Figure 4A:
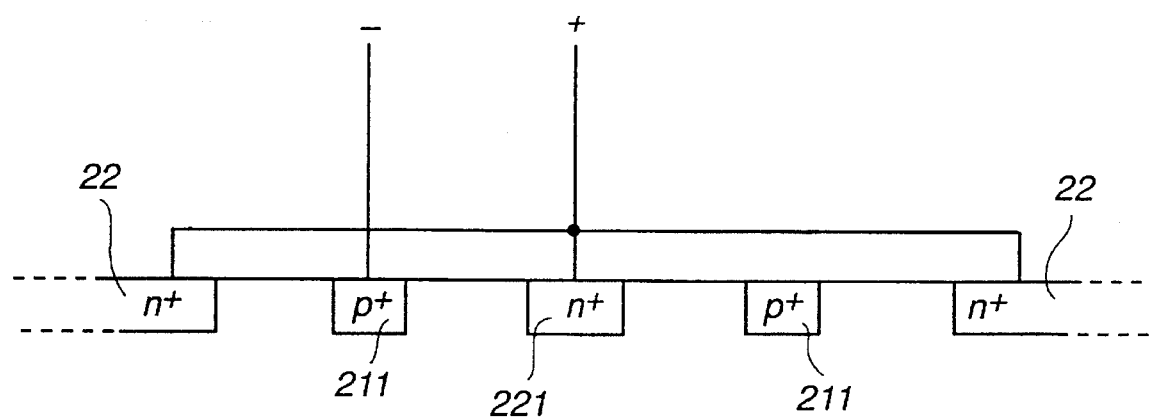
FIG. 4 shows an alternative embodiment of the invention.
Figure 4B:
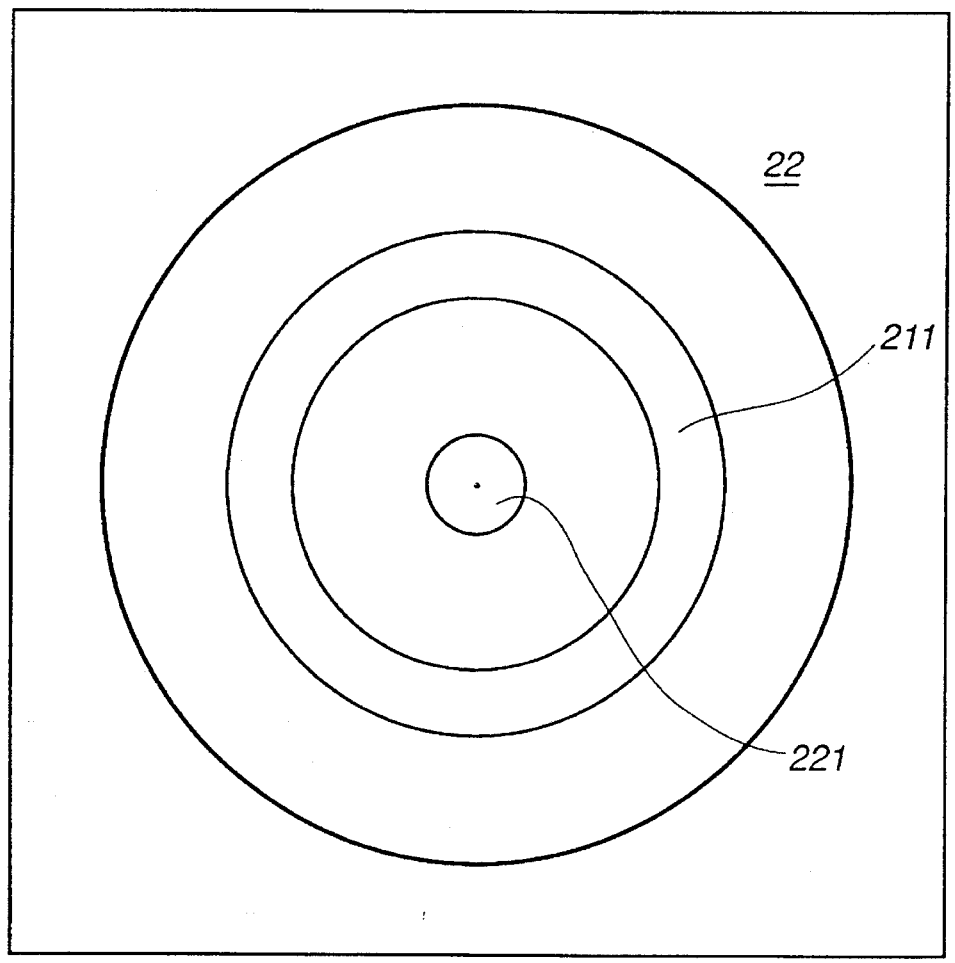

FIG. 4a and FIG. 4b show an alternative embodiment of a detector circuit according to the invention, in which FIG. 4a shows a section through the circuit and FIG. 4b a view of that surface of the circuit where the diode and the amplifier circuits are arranged. The diode 20 has a central $n^+$-doped contact region 221, which is surrounded by an annular $p^+$-doped contact region 211, which in turn is surrounded by the $n^+$-doped contact region 22. The regions 221 and 22 are interconnected and constitute the cathode contact of the diode. The region 211 constitutes the anode contact of the diode. The electrical connections of the diode are schematically shown in the figure. The extent of the depletion layer which is formed when reverse bias voltage is applied across the diode is indicated in the figure by the line 27.

As described above, a detector circuit according to the invention is produced in a homogeneously weakly doped wafer of high-quality (defect free) silicon. By "weakly doped" is meant here that the doping concentration of the silicon wafer is at most $1 \cdot 10^{13}$ cm$^{-3}$, which corresponds to a resistivity of 1000 ohmcm.

A detector circuit according to the invention provides considerable advantages. Since the amplifier circuits can be placed very near the detector diode, a lower signal level from the diode can be accepted, which means that the lateral dimensions of the diode may be smaller, and this in turn results in a low self-capacitance of the diode, and hence in a high speed of action of the entire detector circuit. Further, several functions may be integrated on the same chip. Further, in the circuit according to the invention all contacts are arranged on one and the same side of the semiconductor wafer, which offers considerable advantages from the manufacturing and encapsulation points of view. For the manufacturing process, thus, conventional planar technology can be used both for the diode and for the amplifier circuits. Further, the manufacture of the different regions of the diode can be made simultaneously with and using the same doping methods as the corresponding regions in the amplifier circuits. Also, the necessary protective layers can be applied simultaneously both on the diode and over the amplifier circuits. The latter particularly applies to the silicon nitride layer 102 shown in FIG. 2, which at the same time serves as protective layer for the amplifier circuits and as anti-reflex layer for the diode. Thus, the manufacturing process for a detector circuit according to the invention becomes simple, and to this also contributes the fact that a homogeneous silicon wafer with homogeneous doping is used as basic material. Nor are any particular methods steps for applying epitaxial layers required.

In the embodiment of the invention described above, the amplifier circuits have been assumed to be designed based on CMOS technology. Alternatively, they may be designed based on some other known planar technology process, for example nMOS technology, pMOS technology, etc.

In the embodiments described above, the central contact region or regions and the inner edge of the outer contact region have circular shape (FIG. 4) or the shape of regular polygons (FIG. 1). Alternatively, other shapes may be used within the scope of the invention, for example, rectangular or elliptical shapes. The outer edge of the outer contact region 22 is square in the embodiments described above but this edge may, of course, alternatively be of any arbitrary shape.

In the embodiment described in FIG. 1, one single central contact region 21 is provided, which is surrounded by an outer contact region 22. Alternatively, within the region which is limited by the inner edge of the outer contact region 22, several central contact regions of the same type and being electrically interconnected may be arranged adjacent to each other.

In the embodiments described above, the basic material—the wafer 1—consists of n-conducting silicon with a low doping level. Alternatively, however, the basic material may consist of p-conducting silicon with a low doping level, in which case the other regions of the diode 20 are given a conductivity type opposite to that shown in the embodiments described above.

In a detector circuit according to the invention, several detector diodes may be arranged on the same silicon wafer, in which case separate amplifier circuits are arranged for each diode. The diodes may then, for example, be adapted to receive light from different optical fibres.

In addition to amplifier stages for amplification of the diode signal, additional arbitrary circuits can be arranged in the same silicon wafer and be adapted to cooperate with the diodes and the amplifier circuits. Thus, for example, in the same wafer as the detector circuit, drivers for additional circuits may be arranged, for example DMOS IGBTS or thyristors.

Typical fields of use for a detector circuit according to the invention are for fibre-optic communication or in optocouplers, but a large number of other fields of use are, of course, also feasible.

We claim:

1. A light detector circuit, comprising:
    a homogeneously doped silicon wafer of a first conductivity type N and having a doping concentration no greater than $10^{13}$ cm$^{-3}$;
    a semiconductor lateral type diode and an amplifier circuit integral with said diode; and
    said diode and amplifier circuit are formed in said silicon wafer.

2. A light detector circuit according to claim 1, wherein the diode has a doped first contact region of a second conductivity type (P) at the surface of the silicon wafer,
    at least one doped second contact region of said first conductivity type (N) is at the surface of the silicon wafer, spaced from said first contact region and surrounding said region.

3. A light detector circuit according to claim 1, wherein a radiation protective layer is applied over that part of the surface of the silicon wafer including the amplifier circuit.

4. A light detector circuit according to claim 3, wherein the protective layer is made from a material with low optical reflectance.

5. A light detector circuit according to claim 4, wherein the protective layer consists of a layer of titanium.

6. A light detector circuit according to claim 1, wherein an anti-reflective layer is applied over that part of the surface of the silicon wafer including the diode.

7. A light detector circuit according to claim 6, in which the amplifier is CMOS, further comprising a silicon nitride layer on the surface of the silicon wafer, wherein the anti-reflective layer consists of said silicon nitride layer.

8. A light detector circuit according to claim 1, wherein the doping of the silicon wafer is such that the resistivity thereof is at least 500 ohmcm.

* * * * *